(12) United States Patent
Sakamoto et al.

(10) Patent No.: US 7,675,113 B2
(45) Date of Patent: Mar. 9, 2010

(54) INSULATED GATE TRANSISTOR

(75) Inventors: Shunsuke Sakamoto, Fukuoka (JP);
Eisuke Suekawa, Tokyo (JP); Tetsujiro Tsunoda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 162 days.

(21) Appl. No.: 11/843,301

(22) Filed: Aug. 22, 2007

(65) Prior Publication Data

US 2008/0224207 A1    Sep. 18, 2008

(30) Foreign Application Priority Data

Mar. 14, 2007   (JP) .............................. 2007-064995

(51) Int. Cl.
*H01L 29/739* (2006.01)
*H01L 29/74* (2006.01)
(52) U.S. Cl. ...................... 257/330; 257/139; 257/331; 257/341; 257/578; 257/E29.201
(58) Field of Classification Search ................ 257/139, 257/328–332, 341, 578, 579, E29.201
See application file for complete search history.

(56) References Cited

U.S. PATENT DOCUMENTS

| | | | | |
|---|---|---|---|---|
| 6,359,306 B1 * | 3/2002 | Ninomiya | .................... | 257/328 |
| 6,445,036 B1 * | 9/2002 | Maruoka | .................... | 257/330 |
| 6,891,224 B2 * | 5/2005 | Ogura et al. | ................ | 257/330 |

FOREIGN PATENT DOCUMENTS

| | | |
|---|---|---|
| DE | 101 61 129 A1 | 12/2002 |
| EP | 1 760 790 A1 | 3/2007 |
| JP | 2002-16252 | 1/2002 |

* cited by examiner

*Primary Examiner*—Jerome Jackson, Jr.
*Assistant Examiner*—Yu Chen
(74) *Attorney, Agent, or Firm*—Oblon, Spivak, McClelland, Maier & Neustadt, L.L.P.

(57) ABSTRACT

A charge storage layer of first conductive type is formed on the first principal surface of a semiconductor substrate. A base layer of second conductive type is formed on the charge storage layer. Each trench formed through the base layer and the charge storage layer is lined with an insulating film and filled with a trench gate electrode. Dummy trenches are formed on both sides of each trench. Source layers of first conductive type are selectively formed in the surface of the base layer and in contact with the sidewalls of the trenches. The source layers are spaced apart from each other and arranged in the longitudinal direction of the trenches. A contact layer of second conductive type is formed in the surface of the base layer and between each two adjacent source layers arranged in the longitudinal direction of the trenches. A collector layer of second conductive type is formed on the second principal surface of the semiconductor substrate.

5 Claims, 2 Drawing Sheets

INSULATED GATE TRANSISTOR

FIELD OF THE INVENTION

The present invention relates to insulated gate transistors used to form an inverter, etc., and more particularly to insulated gate transistors adapted to exhibit reduced variation in current in short circuit mode and have adequate resistance to electrical breakdown.

BACKGROUND ART

There is a type of insulated gate bipolar transistor (IGBT) with a trench gate structure that includes dummy trenches (which do not constitute part of the channels) to reduce the current in short circuit mode and prevent electrical breakdown (see, e.g., JP-A-2002-16252).

FIG. 4 is a top view of a conventional insulated gate transistor. Referring to the figure, dummy trenches 17 are formed on both sides of trenches 14, and n-type source layers 21 are selectively formed in the surface of a p-type base layer 13 and in contact with the sidewalls of the trenches 14. Further, $p^+$ type contact layers 22 are formed in the surface of the base layers 13 and between the trenches 14 and the dummy trenches 17.

Thus in conventional insulated gate transistors, the source layers 21 are formed between the contact layers 22 and the trenches 14, and these source layers 21 act as source ballast resistances 27 (see FIG. 4). It has been found, however, that the values of the ballast resistances 27 vary with variations in the patterning accuracy of the source and trench forming processes, which results in variations in current in short circuit mode and which may result in reduced resistance to electrical breakdown.

SUMMARY OF THE INVENTION

The present invention has been devised to solve the above problems. It is, therefore, an object of the present invention to provide an insulated gate transistor adapted to exhibit reduced variation in current in its short circuit mode and have adequate resistance to electrical breakdown.

According to one aspect of the present invention, a charge storage layer of first conductive type is formed on the first principal surface of a semiconductor substrate. A base layer of second conductive type is formed on the charge storage layer. Each trench formed through the base layer and the charge storage layer is lined with an insulating film and filled with a trench gate electrode. Dummy trenches are formed on both sides of each trench. Source layers of first conductive type are selectively formed in the surface of the base layer and in contact with the sidewalls of the trenches. The source layers are spaced apart from each other and arranged in the longitudinal direction of the trenches. A contact layer of second conductive type is formed in the surface of the base layer and between each two adjacent source layers arranged in the longitudinal direction of the trenches. A collector layer of second conductive type is formed on the second principal surface of the semiconductor substrate.

Thus, the present invention allows an insulated gate transistor to exhibit reduced variation in current in its short circuit mode and have adequate resistance to electrical breakdown.

Other and further objects, features and advantages of the invention will appear more fully from the following description.

DETAILED DESCRIPTION OF THE PREFERRED EMBODIMENTS

First Embodiment

Figure 1:
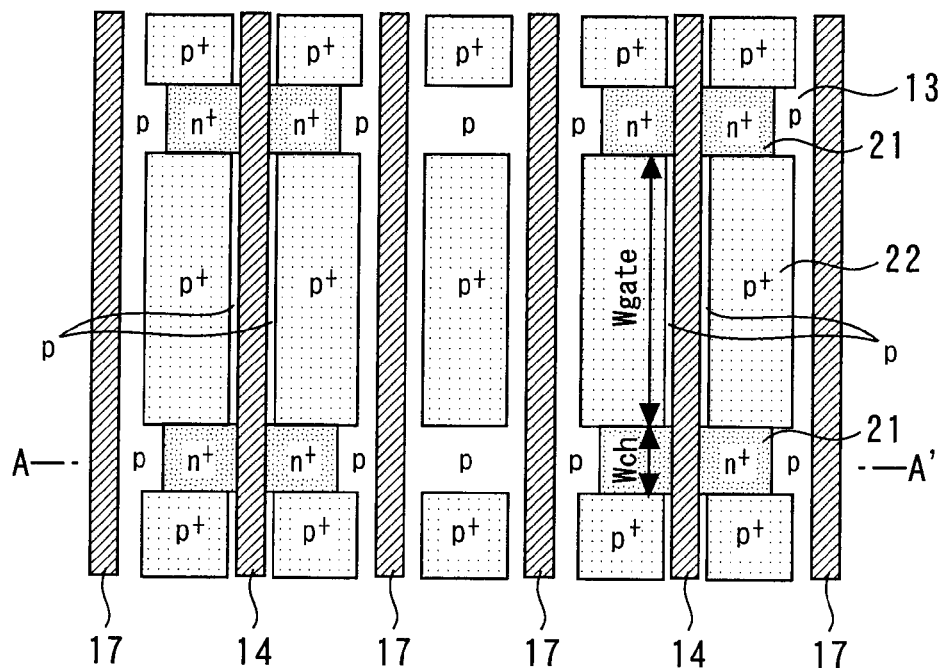
FIG. 1 is a top view of an insulated gate transistor according to a first embodiment of the present invention.
Figure 2:
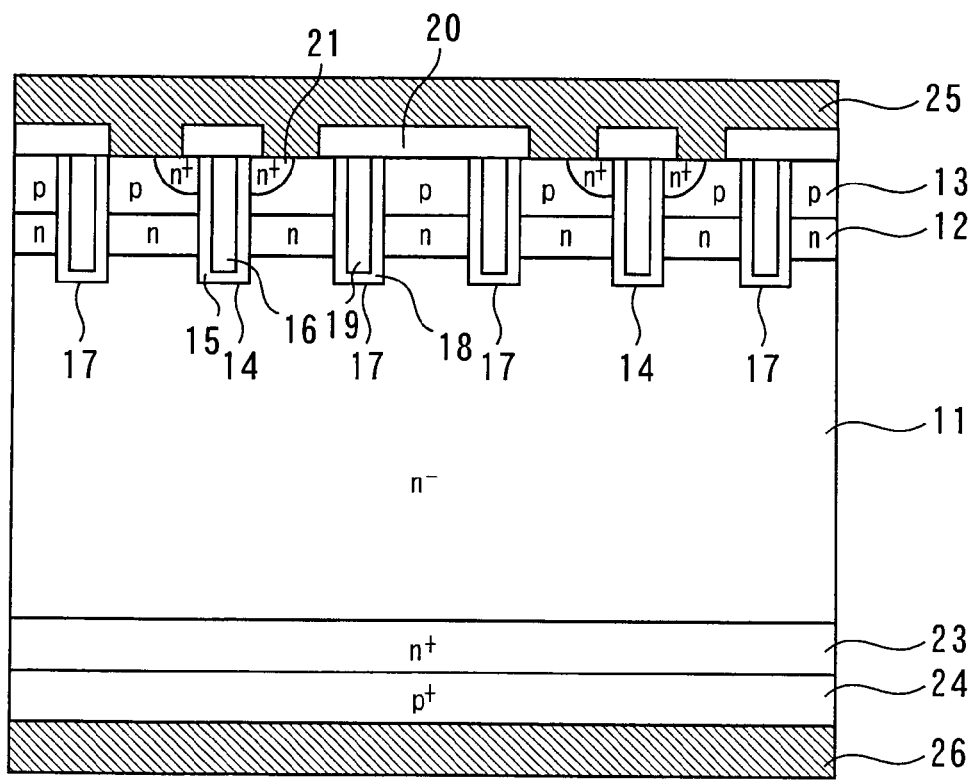
FIG. 2 is a cross-sectional view taken along line A-A' of FIG. 1.

FIG. 1 is a top view of an insulated gate transistor according to a first embodiment of the present invention, and FIG. 2 is a cross-sectional view taken along line A-A' of FIG. 1.

Referring to FIGS. 1 and 2, an n-type charge storage layer 12 is formed on the top surface (or first principal surface) of an n-type semiconductor substrate 11, and a p-type base layer 13 is formed on the charge storage layer 12.

A plurality of trenches 14 are formed through the base layer 13 and the charge storage layer 12 and disposed in parallel to each other (i.e., arranged in stripes). Each trench 14 is lined with an insulating film 15 and filled with a trench gate electrode 16. Dummy trenches 17 are formed on both sides of each trench 14 and disposed in parallel to each other (i.e., arranged in stripes). These dummy trenches 17 also penetrate through the base layer 13 and the charge storage layer 12. Each dummy trench 17 is lined with an insulating film 18 and filled with a dummy trench gate electrode 19. The dummy trench gate electrodes 19 are not electrically coupled to the trench gate electrodes 16. Insulating films 20 are formed on their respective trench gate electrodes 16 and dummy trench gate electrodes 19.

$N^+$ type source layers 21 are selectively formed in the surface of the base layer 13 and in contact with the sidewalls of the trenches 14. The source layers 21 are spaced apart from each other and arranged in the longitudinal direction of the trenches 14. A $p^+$ type contact layer 22 is formed in the surface of the base layer 13 and between each two adjacent source layers 21 arranged in the longitudinal direction of the trenches 14.

An $n^+$ type buffer layer 23 is formed on the bottom surface (or second principal surface) of the semiconductor substrate 11, and a $p^+$ type collector layer 24 is formed on the buffer layer 23. Further, an emitter electrode 25 is coupled to the source layers 21 and the contact layers 22, and a collector electrode 26 is coupled to the collector layer 24.

Thus, the insulated gate transistor of the present embodiment is a "carrier storage trench IGBT" which includes the n-type charge storage layer 12 formed under the p-type base layer 13 to store carriers. In a conventional trench IGBT, the hole density (or hole concentration) decreases with decreasing distance from the emitter, whereas in this "carrier storage trench IGBT," the hole concentration is high even on the emitter side, resulting in a reduced turn-on voltage (or saturation voltage). As a result, it is possible to improve the trade-off between the saturation voltage and the turn-off energy.

Further, since the n⁺ type source layers 21 and the p⁺ type contact layers 22 are alternately arranged in the longitudinal direction of the trenches 14, the n⁺ type source layers 21 and the base layer 13 which are adjacent each other in the width direction of the channels are electrically connected together by the emitter electrode 25. This prevents latch-up of a parasitic npnp thyristor formed by the n⁺ type source layers 21, the p-type base layer 13, the n-type semiconductor substrate 11, and the p-type collector layer 24.

Further, according to the present embodiment, the source layers 21 are spaced apart from each other and arranged in the longitudinal direction of the trenches 14. That is, the source layers 21 are not located between the contact layers 22 and the trenches 14, meaning that this insulated gate transistor does not include source ballast resistances whose values vary with variations in the patterning accuracy of the source and trench forming processes. This arrangement enables the insulated gate transistor to exhibit reduced variation in current in its short circuit mode and maintain resistance to electrical breakdown.

It should be noted that the dimensions of the source layers 21 are optimally determined by considering the trade-off between the current-carrying capacity and the short-circuit current. Specifically, the source layers 21 are preferably formed such that the ratio of the width (or channel width) $W_{ch}$ of the source layers 21 to the distance $W_{gate}$ between adjacent source layers 21 in the longitudinal direction of the trenches 14 is 0.1-0.5. This enables the insulated gate transistor to exhibit reduced variation in short-circuit current and maintain resistance to electrical breakdown.

Further, the dummy trench gate electrodes 19 are preferably held at the same potential (GND) as the emitter electrode 25 to reduce the gate capacitance.

Further, the width $W_{ch}$ of the source layers 21 is preferably 1.0 μm or more. With this arrangement, the variation in the short-circuit current with variations in the width $W_{ch}$ of the source layers 21 can be limited to 20% or less when the patterning accuracy of the source layer 21 forming process is ±0.2 μm. Thus, the dimensions of the source layers 21 are optimally determined to reduce the variation in short-circuit current.

Second Embodiment

Figure 3:
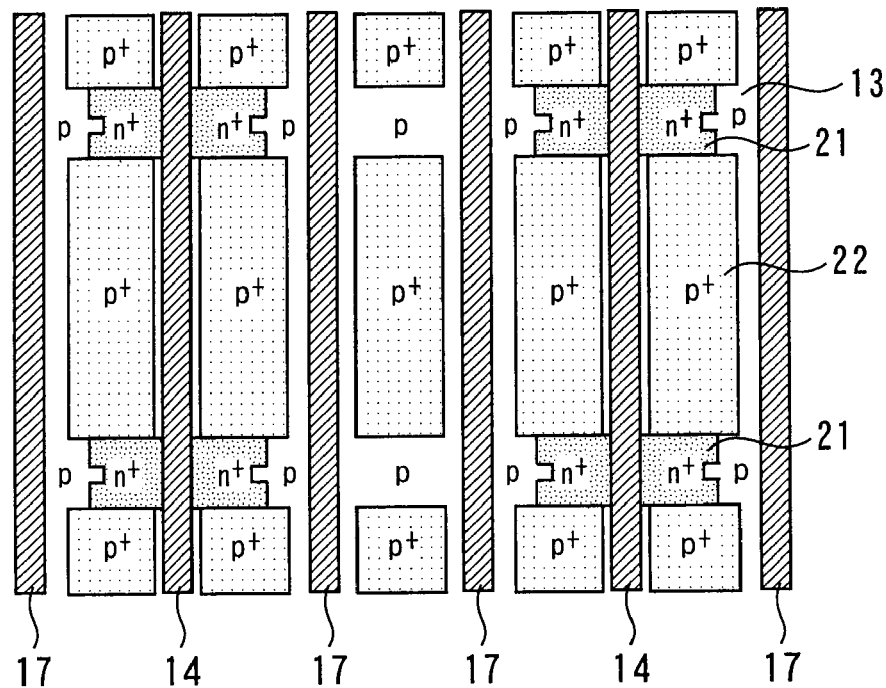
FIG. 3 is a top view of an insulated gate transistor according to a second embodiment of the present invention.
Figure 4:
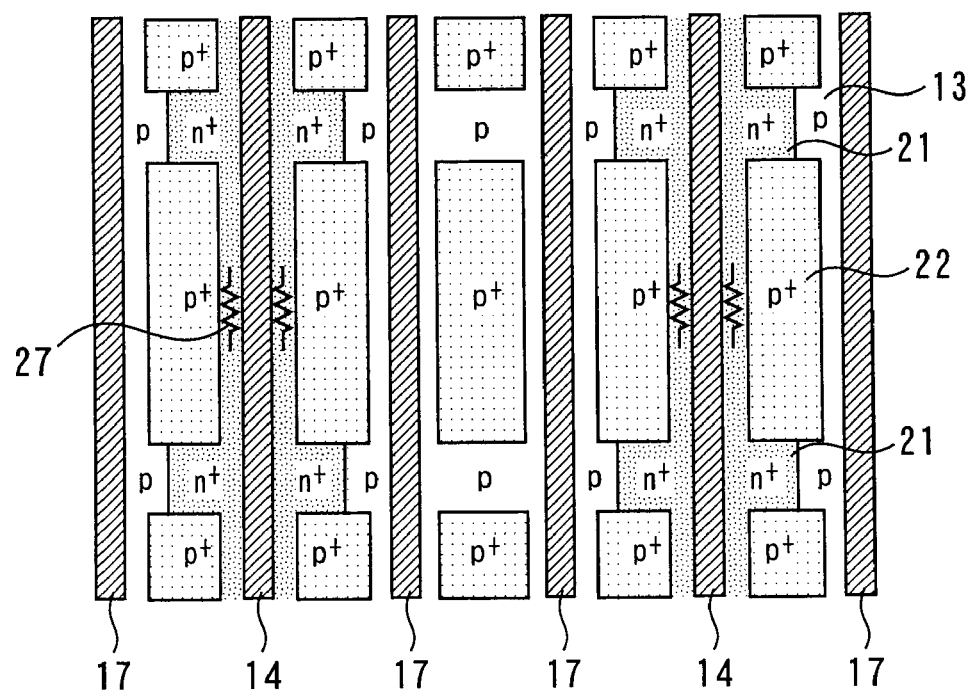
FIG. 4 is a top view of a conventional insulated gate transistor.

FIG. 3 is a top view of an insulated gate transistor according to a second embodiment of the present invention. This insulated gate transistor differs from that of the first embodiment in that each source layer 21 has a partial notch. This arrangement allows a reduction in the resistance of the base layer 13 under the source layers 21, making it possible to prevent latch-up of a parasitic transistor in the insulated gate transistor and thereby prevent a reduction in the resistance to electrical breakdown.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-064995, filed on Mar. 14, 2007 including specification, claims, drawings and summary, on which the Convention priority of the present application is based, are incorporated herein by reference in its entirety.

What is claimed is:

1. An insulated gate transistor comprising:
    a semiconductor substrate of a first conductive type having a first principal surface and a second principal surface;
    a charge storage layer of said first conductive type formed on said first principal surface of said semiconductor substrate;
    a base layer of a second conductive type formed on said charge storage layer;
    trenches formed through said base layer and said charge storage layer, said trenches being lined with a first insulating film;
    trench gate electrodes each filling a respective one of said trenches;
    dummy trenches formed through said base layer and said charge storage layer, respective dummy trenches being arranged adjacent to both sides of each of said trenches, said dummy trenches being lined with a second insulating film;
    dummy trench gate electrodes each filling a respective one of said dummy trenches, said dummy trench gate electrodes being electrically unconnected to said trench gate electrodes;
    source layers of said first conductive type selectively formed in a surface of said base layer, respective source layers being in contact with sidewalls on each side of each of said trenches, said source layers being spaced apart from each other and arranged in a longitudinal direction of said trenches;
    contact layers of said second conductive type formed in said surface of said base layer and being arranged between said source layers in said longitudinal direction of said trenches, the base layer is provided between the contact layers and each of the sidewalls of the trenches and between the contact layers and each of the sidewalls of the dummy trenches, without any portion of the source layers being provided between the contact layers and each of the sidewalls of the trenches and between the contact layers and each of the sidewalls of the dummy trenches;
    a collector layer of said second conductive type formed on said second principal surface of said semiconductor substrate;
    an emitter electrode coupled to said source layers and said contact layers; and
    a collector electrode coupled to said collector layer.

2. The insulated gate transistor as claimed in claim 1, wherein the ratio of a width of each of said source layers to the distance between adjacent ones of each of said source layers is 0.1-0.5, said adjacent ones of each of said source layers being arranged in said longitudinal direction of said trenches, and said width of each of said source layers being measured in said longitudinal direction of said trenches.

3. The insulated gate transistor as claimed in claim 1, wherein said dummy trench gate electrodes are held at a same potential as said emitter electrode.

4. The insulated gate transistor as claimed in claim 1, wherein a width of each of said source layers in said longitudinal direction of said trenches is 1.0 μm or more.

5. The insulated gate transistor as claimed in claim 1, wherein each of said source layers has a partial notch.

* * * * *